(12) United States Patent
Aliberti

(10) Patent No.: US 9,430,346 B2
(45) Date of Patent: Aug. 30, 2016

(54) PROCESSOR POWER MEASUREMENT

(71) Applicant: TEXAS INSTRUMENTS INCORPORATED, Dallas, TX (US)

(72) Inventor: James H. Aliberti, North Attleboro, MA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 263 days.

(21) Appl. No.: 14/223,665

(22) Filed: Mar. 24, 2014

(65) Prior Publication Data
US 2014/0298094 A1 Oct. 2, 2014

Related U.S. Application Data

(60) Provisional application No. 61/805,434, filed on Mar. 26, 2013.

(51) Int. Cl.
G06F 1/00 (2006.01)
G06F 1/26 (2006.01)
G06F 11/24 (2006.01)
G06F 1/28 (2006.01)
G06F 11/26 (2006.01)
G01R 31/28 (2006.01)
G01R 31/27 (2006.01)
G01R 31/30 (2006.01)

(52) U.S. Cl.
CPC .............. *G06F 11/24* (2013.01); *G06F 1/28* (2013.01); *G01R 31/275* (2013.01); *G01R 31/28* (2013.01); *G01R 31/3004* (2013.01); *G06F 11/26* (2013.01)

(58) Field of Classification Search
CPC ......... G06F 11/24; G06F 1/26; G01R 31/28; G01R 31/275; G01R 31/3004
USPC ........................................ 713/300, 320, 340
See application file for complete search history.

(56) References Cited

U.S. PATENT DOCUMENTS

| | | | |
|---|---|---|---|
| 7,248,980 B1 | 7/2007 | Gross et al. | |
| 7,490,254 B2 | 2/2009 | Clark | |
| 7,629,833 B2 | 12/2009 | Kim et al. | |
| 7,663,517 B1 | 2/2010 | Rao et al. | |
| 8,570,071 B2 | 10/2013 | Lee | |
| 2004/0003303 A1 | 1/2004 | Oehler et al. | |
| 2005/0248895 A1* | 11/2005 | MacLean | H02H 5/044 361/103 |

(Continued)

FOREIGN PATENT DOCUMENTS

EP     0 600 726 A2    12/1993

OTHER PUBLICATIONS

Search Report for PCT/US14/031904, mailed Sep. 30, 2014.

*Primary Examiner* — Michael J Brown
(74) *Attorney, Agent, or Firm* — William B. Kempler; Frank D. Cimino

(57) ABSTRACT

A system can include a processing core to execute machine readable instructions. The system can also include a memory accessible by the processor core. The memory can include preprogrammed test data that characterizes one of an impedance of a processor and a current output to the processor during execution of a test routine. The processor can include the processing core and the one of the impedance of the processor and the current output to the processor is based on a power measurement taken during execution of a test routine. The power measurement can be taken with a current sensor that is at least one of lossy or at least about 98% accurate.

19 Claims, 5 Drawing Sheets

(56) References Cited

U.S. PATENT DOCUMENTS

| | | |
|---|---|---|
| 2005/0270005 A1 | 12/2005 | Horner |
| 2009/0177904 A1 | 7/2009 | Kern et al. |
| 2010/0332169 A1* | 12/2010 | Liang ................. G01R 31/2805 702/65 |
| 2011/0089914 A1 | 4/2011 | Harman |
| 2012/0047385 A1 | 2/2012 | Henry et al. |

* cited by examiner

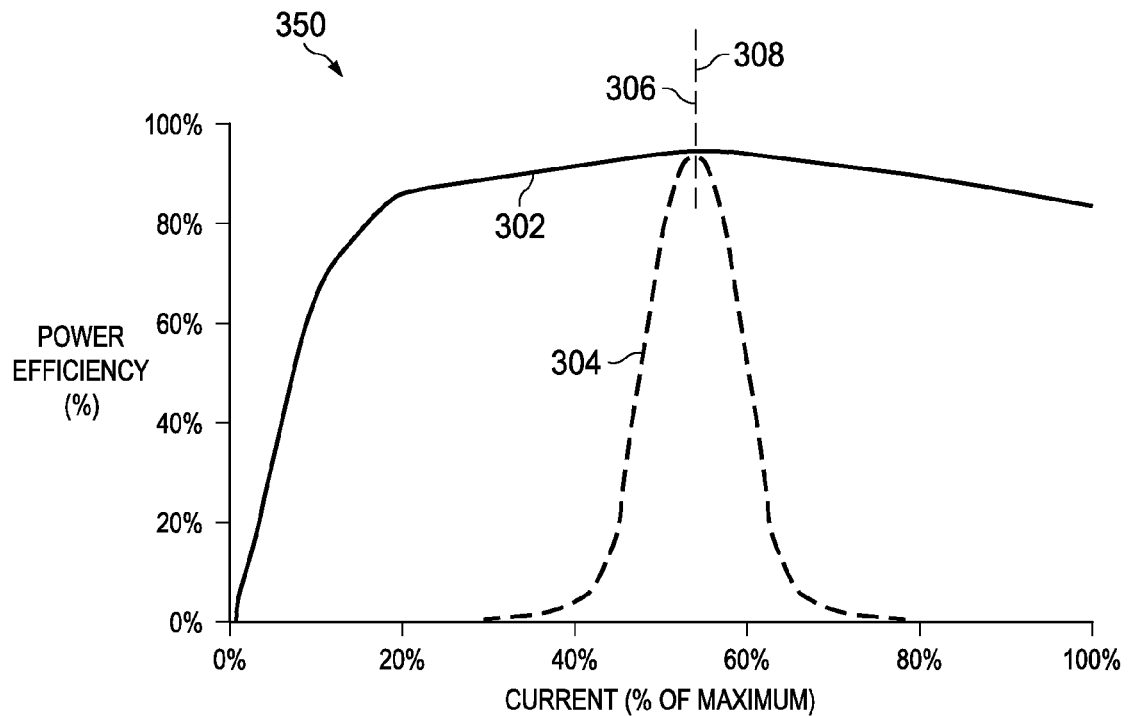
FIG. 7
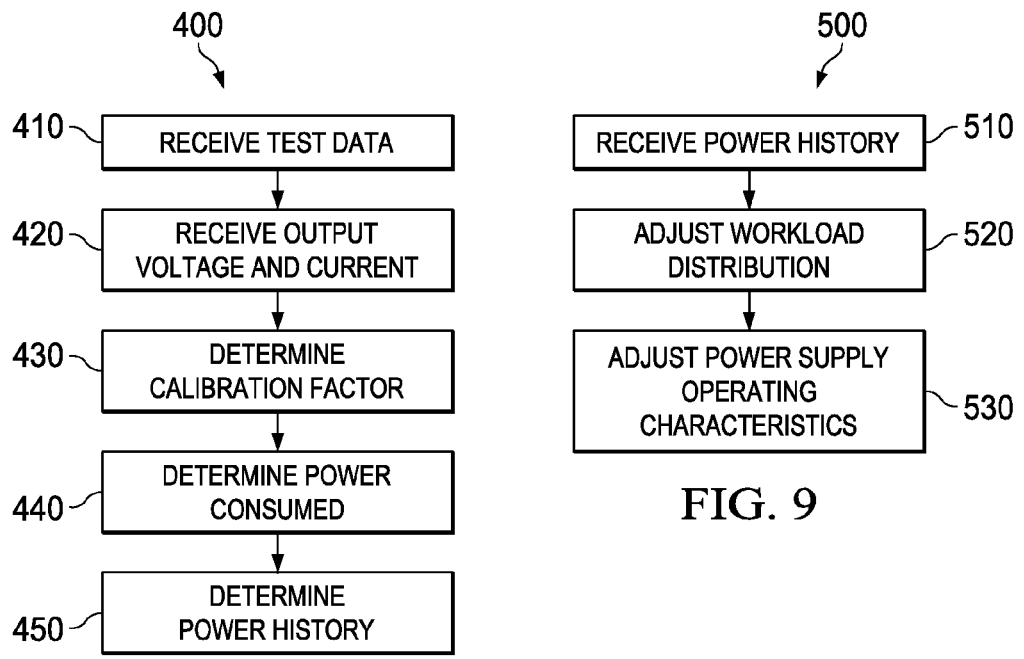
FIG. 8
FIG. 9

PROCESSOR POWER MEASUREMENT

CROSS-REFERENCE TO RELATED APPLICATION

This application claims the benefit of U.S. Provisional Application No. 61/805,434, filed Mar. 26, 2013 and entitled DATACENTER POWER UTILIZATION OPTIMIZATION AND ENERGY SAVING CONCEPTS AND IP, which is incorporated herein by reference in its entirety.

TECHNICAL FIELD

This disclosure relates to processor power measurement.

BACKGROUND

A processing core voltage ($V_{CORE}$) is the power supply voltage supplied to a central processing unit (CPU), graphical processing unit (GPU), application specific integrated circuit (ASIC), microcontroller or other device containing a processing core. The amount of power a processing core consumes, and thus the amount of heat the processing core dissipates is the product of this voltage and the current the processing core draws. In some processing cores, the current can be proportional to the clock speed of the processing core.

SUMMARY

This disclosure relates to processor power measurement.

One example relates to a system that can include a processing core configured to execute machine readable instructions. The system can also include memory accessible by the processing core. The memory can include preprogrammed test data that characterizes one of an impedance of a processor and a current output to the processor during execution of a test routine. The processor can include the processing core and the one of the impedance of the processor and the current output to the processor can based on a power measurement taken during execution of the test routine. The power measurement can be taken with a current sensor that is at least one of lossy or at least about 98% accurate.

Another example relates to a method that can include executing a test routine on a processor that executes machine readable instructions. The method can also include measuring, with a lossy current measuring device, a current provided to the processor during the test routine. The test routine can include a plurality of machine readable instructions. The method can further include storing test data that characterizes the measuring in a memory.

Yet another example relates to a data center that can include a plurality of computers that are each configured to store a power history. A given power history of a given computer of the plurality of computers can include a time-stamped instance of a calculated power consumed by the given computer. The calculated power can be based on a real-time measured current provided to the given computer and a calibration factor. The calibration factor can be based on test data characterizing one of an impedance of a processor of the given computer and a current provided to the processor of the given computer during execution of a test routine by the processor. The data center controller can be configured to adjust a workload assigned to each of the computers based on the power history of each of the computers.

BRIEF DESCRIPTION OF THE DRAWINGS

FIG. 7 illustrates another example of a graph that plots power efficiency as a function of a percentage of maximum current.

FIG. 8 illustrates an example flowchart of a method for determining a power consumed by a component.

FIG. 9 illustrates an example flowchart of a method for managing power efficiency of a module.

DETAILED DESCRIPTION

This disclosure relates to processor power measurement, such as may include execution of a power test on a processor. In one example, a test routine (e.g., a series of machine executable instructions) can be executed by a processor in a test facility. During execution of the test routine, power measurements, including a current and voltage provided to the processor can be recorded as test data. In some examples, the current and voltage applied to the processor can be employed to determine an impedance of the processor.

Upon installation of the processor in a computer system, the test routine can be re-executed. During re-execution of the test routine, a (relatively inaccurate) current measurement can be compared with the measured current provided to the processor at the test facility to determine a calibration factor. The calibration factor can be employed to calibrate the real-time measurement of current to increase an accuracy of calculations relating to power consumption of the processor. Accurate data that characterizes the power consumption of the processor over a period of time (e.g., a power history) can be employed, for example, to adjust a workload of the computer system to increase an overall power efficiency of a data center that includes the computer system.

Figure 1:
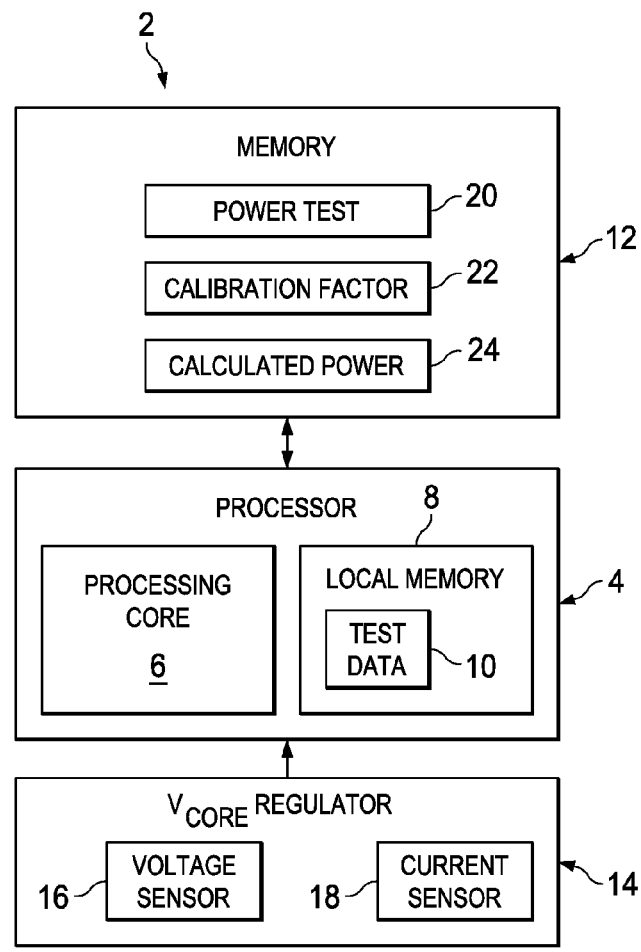
FIG. 1 illustrates an example of a system with a processor for calibrating a power measurement.

FIG. 1 illustrates an example of a system 2 that includes a processor 4 for calibrating a power measurement. The system 2 can be implemented, for example, as a computer, a programmable logic controller (PLC) or the like. The system 2 can be a stand-alone system or a component of a data center (e.g., a server cluster or a cloud computer system). The processor 4 can be implemented as an integrated circuit (IC) chip configured to execute machine readable instructions. The processor 4 could be implemented, for example, as a central processing unit (CPU), an application specific integrated circuit (ASIC) chip, a microcontroller or the like.

The processor 4 can include a processing core 6 that can execute machine readable instructions. In some examples, the processor 4 can be a multi-core processor that includes a plurality of processing cores. The processor 4 can include on-board (e.g., embedded) local memory 8, such as one-time programmable (OTP) memory registers and/or rewriteable memory registers that include test data 10. The test data can be programmed to characterize results of one or more previously executed test routines (e.g., power measurements). The local memory 8 can be a non-transitory machine readable medium. In some examples, the test data 10 can characterize a measured impedance of the processor 4. In such a situation, the measured impedance can be determined during execution of the predetermined test routine. In some examples, the test data 10 can be stored in external memory, such as memory 12. The memory 12 could be implemented, for example, as a non-transitory machine readable medium, such as volatile memory (e.g., random access memory (RAM)), non-volatile memory (e.g., a hard disk drive, a solid state drive or the like) or a combination thereof. In some examples, the memory 12 could be the main memory of the system 2. Additionally or alternatively, the memory 12 could include a subsystem memory, such as the memory of a Basic Input/Output System (BIOS).

In some examples, the test data 10 can also include a test routine that can be implemented as a series of machine readable instructions employed to determine a measured impedance for the processor 4, $Z_{proc}$. Moreover, the test data 10 can include a clock speed characterizing a clock speed of the processor 4 that the processor 4 executed the test routine to determine the measured impedance, $Z_{proc}$. In some examples, the test data 10 can include multiple instances of the measured impedance $Z_{proc}$, along with a corresponding test routine and/or a clock speed. In some examples, the test data can include a test routine identifier (ID) that identifies a location (e.g., a memory address or a uniform resource identifier (URI)) of the test routine.

The processor 4 can receive a power signal from a processing core voltage ($V_{CORE}$) regulator 14 that can be implemented, for example as a direct current (DC)-to-DC converter. The $V_{CORE}$ regulator 14 can convert a voltage provided from a power supply to a $V_{CORE}$ voltage specified by a manufacturer of the processor 4. The $V_{CORE}$ regulator 14 can include a voltage sensor 16 configured to measure a real-time output voltage supplied to the processor 4. The voltage sensor 16 can be implemented, for example, as an analog-to-digital converter (ADC) that can provide a relatively accurate measurement of the output voltage of the $V_{CORE}$ regulator 14. The $V_{core}$ regulator 14 can be a single phase DC-to-DC converter or a multiphase (e.g., a 6 phase) DC-to-DC converter.

The $V_{CORE}$ regulator 14 can include a current sensor 18 configured to measure a real-time output current supplied to the processor 4. The current sensor 18 can be implemented, for example, as a substantially lossless current sensor, such as an inductor direct-current resistor (DCR) sensor, a metal-oxide-semiconductor field-effect transistor (MOSFET) current mirror or the like. The current measured by the current sensor 18 is relatively inaccurate due to tolerances of circuit components in the current sensor 18. For example, the current sensor 18 can include an inductor with a magnetic core. Temperature effects on the magnetic core can introduce inaccuracies in the measured output current.

The $V_{CORE}$ regulator 14 can include circuitry that can output data to the processor 4 that characterizes the real-time measured output voltage, $V_{m-out}$ and the real-time measured output current, $I_{m-out}$. As an example, the circuitry can include a telemeter configured to provide the measured voltage and current $V_{m-out}$ and $I_{m-out}$ to the processor 4 (e.g., via a physical connection, such as the power supply connection or a separate connection). A power test 20 can be stored in the memory 12 of the system 2. The power test 20 can be configured to provide a measured power consumed by the processor 4. Moreover, the power test 20 can be configured to execute a calibration process to increase the accuracy of the measured power consumed by the processor 4.

During the calibration process, the power test 20 can access the test data 10. Moreover, the power test 20 can cause the processor 4 to execute the same test routine that was executed to generate the measured impedance, $Z_{proc}$ and at the same clock speed. The measured output voltage of the $V_{CORE}$ regulator 14, $V_{m-out}$ can be relatively accurate compared to the measured current, $I_{m-out}$. Thus, the measured output voltage can be divided by the impedance of the processor 4, $Z_{proc}$ to provide a determined output current, $I_{d-out}$. Equation 1 characterizes this relationship:

$$I_{d-out} = \frac{V_{m-out}}{Z_{proc}} \qquad \text{Equation 1}$$

In some examples, the determined output current, $I_{d-out}$ (or an equivalent value) can be stored in the test data 10. For instance, a value corresponding to a measured test output current (explained herein), $I_{mt-out}$ can be stored in the test data 10. In such a situation, the measured test output current, $I_{mt-out}$ can be employed as the determined output current, $I_{d-out}$, wherein $I_{d-out} \approx I_{mt-out}$. The determined output current, $I_{d-out}$, can be compared with the measured current, $I_{m-out}$ to determine a calibration factor, $C_{factor}$ for the calibration process of the power test 20. Thus, the calibration factor, $C_{factor}$ can characterize a deviation between the measured current, $I_{m-out}$ and the measured test current, $I_{mt-out}$ or the determined output current, $I_{d-out}$. Equation 2 can be employed to calculate the calibration factor, $C_{factor}$.

$$C_{factor} = \frac{I_{d-out} - I_{m-out}}{I_{m-out}} + 1 \qquad \text{Equation 2}$$

The calibration factor, $C_{factor}$ can be stored in the memory 12 as a calibration factor 22 to complete the calibration process. Upon determining the calibration factor, $C_{factor}$, the power test 20 can continually calculate the power employed by the processor 4, $P_{proc}$. The calculated power employed by the processor 4, $P_{proc}$ can be calculated with Equation 3.

$$P_{proc} = V_{m-out} * (C_{factor} * I_{m-out}) \qquad \text{Equation 3:}$$

The calculated power consumed by the processor 4, $P_{proc}$ can be stored in the memory 12 as calculated power 24, which can also include a corresponding time stamp corresponding to a time when the measurement is made. Moreover, additional instances of the calculated power and corresponding time stamps can be stored in the memory 12. By employment of the system 2 and corrections based on the derived calibration factor $C_{factor}$, an accurate power history for the system 2 can be determined without including lossy components, such as a shunt-resistor in the current sensor 18 that could lower the power efficiency of the system 2. Employment of the accurate power history can be employed, for example, to control workload distribution assigned to the system 2 (e.g., in a server farm). As explained herein, control of the workload distribution can facilitate operation of the system 2 at a peak (or near peak) power efficiency.

Figure 2:
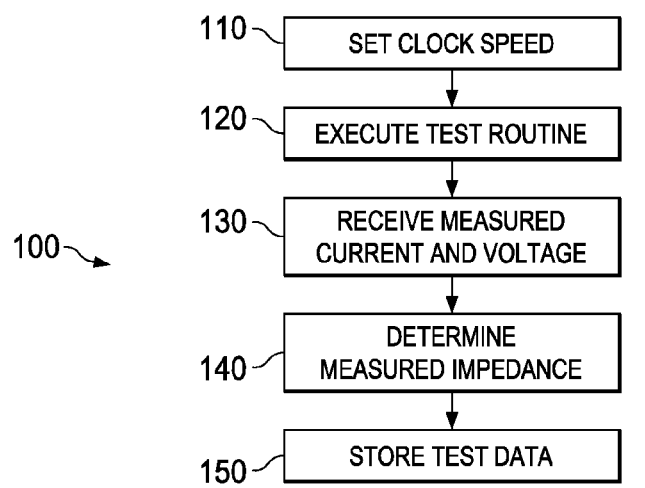
FIG. 2 illustrates a flowchart of an example method of determining test data for a processor.

In view of the foregoing structural and functional features described above, example methods will be better appreciated with reference to FIGS. 2, 8 and 9. While, for purposes of simplicity of explanation, the example methods of FIGS. 2, 8 and 9 are shown and described as executing serially, it is to be understood and appreciated that the presence examples are not limited by the illustrated order, as some actions could in other examples occur in different orders, multiple times and/or concurrently from that shown and described herein. Moreover, it is not necessary that all described actions be performed to implement a method. The example method of FIG. 2 can be implemented in a production test environment as machine executable instructions. The instructions can be accessed by a processing resource (e.g., one or more processor cores) and executed to perform the methods disclosed herein.

FIG. 2 illustrates an example of a method for determining test data for a processor. The method 100 can be implemented, for example, in a test facility after fabrication of a processor (e.g., the processor 4 illustrated in FIG. 1). In the method 100, the processor can be coupled to a power supply. In such a situation, the processor can receive power at pins coupled to output terminals of the power supply. At 110, a clock speed of the processor can be set. At 120, a test routine can be executed by the processor. The test routine could be, for example, a series of machine executable instructions that cause the processor to consume power in a predictable way. For instance, in one example, the test routine could be a series of instructions that cause the processor to linearly ramp the power usage from about a predetermined minimum power usage to about a predetermined maximum power usage. Additionally or alternatively, the test routine could include a series of instructions that cause the processor to consume a relatively constant amount of power. Additionally or alternatively, the test routine could include a series of instructions that cause the processor to consume a stepped amount of power that increments according to a prescribed step size from about the minimum power usage to about the maximum power usage.

At 130, a measured test voltage, $V_{mt-out}$ output by the power supply and a measured test current, $I_{mt-out}$ output by the power supply can be received at the processor. The measured test voltage, $V_{mt-out}$ can be determined, for example, by a voltmeter or an ADC coupled to the output terminals of the power supply. Additionally, the measured test current, $I_{mt-out}$ can be determined for example, with a lossy current measuring device that is coupled to the output terminals of the power supply. The lossy current measuring such as can be implemented to include an ammeter, a shunt resistor, current transformer, etc. The lossy signal measuring device, such as can absorb about 5% or more of the power of a signal being measured. The power loss can be due to dissipation of power via the sensor or due to amplification and/or processing of the sensed signal. Additionally, the lossy measuring device can be accurate, such that the measured test current, $I_{mt-out}$ has an accuracy greater than about 98% (e.g., only about 2% or less inaccurate). In this manner, both the measured test voltage, $V_{mt-out}$ and the measured test current $I_{mt-out}$ can be determined with a high degree of accuracy. At 140, the processor can employ the measured test voltage $V_{mt-out}$ and the measured test current $I_{mt-out}$ to determine a measured impedance for the processor, $Z_{proc}$. As one example, Equation 4 can be employed to determine the measured impedance for the processor, $Z_{proc}$.

$$Z_{proc} = \frac{V_{mt-out}}{I_{mt-out}} \qquad \text{Equation 4}$$

At 150, test data (e.g., the test data 10 of FIG. 1) can be stored. In some examples, the test data can be stored in memory local to the processor, such as a register of the processor. In other examples, the test data can be stored in memory external to the processor, such as memory of a BIOS or in other non-volatile memory. The test data can be implemented, for example, as the measured test voltage, $V_{mt-out}$ and the measured test current $I_{mt-out}$ and/or the measured impedance for the processor, $Z_{proc}$. It is noted that the method 100 can be repeated for different clock speeds and/or different test routines. In such a situation, the test data can be implemented as a table that stores a plurality of measured impedances for the processor, $Z_{proc}$ as well as data identifying a corresponding test routine and/or a corresponding clock speed. The data identifying the test routine could be for example, a test routine identifier (ID) or a series of instructions for a particular test routine. Accordingly, in this situation, Table 1 is an example of information that could be included as the test data. In other examples, the measured test voltage, $V_{mt-out}$ and the measured test current $I_{mt-out}$ can additionally or alternatively be stored in the table.

TABLE 1

MEASURED IMPEDANCE, Zproc (Ohms)

| CLOCK SPEED (GHz) | TEST ROUTINE | | |
|---|---|---|---|
| | 1 | 2 | 3 |
| 3.8 | 74 | 74 | 76 |
| 3.9 | 75 | 74 | 77 |
| 4 | 78 | 74 | 80 |

As noted with respect to FIG. 1, the measured test voltage, $V_{mt-out}$ and the measured test current $I_{mt-out}$ and/or the measured impedance for the processor, $Z_{proc}$ can be employed in calibrate process of a power test.

It is noted that in some examples, the method 100 can be repeated for different processors. Moreover, in some examples, if enough processors fabricated with the same parameters are tested, the measured test voltage $V_{mt-out}$ and the measured test current $I_{mt-out}$ and/or the measured impedance for the processor, $Z_{proc}$ for each tested processor may be identical (or nearly identical). In such a situation, the measured test voltage, $V_{mt-out}$ and the measured test current $I_{mt-out}$ and/or the measured impedance for a given processor, $Z_{proc}$ may be written to a memory without actually performing the actions 110-150 based on the previous tests of other processors. In other examples, the method can be implemented for each of the processors and the test results be collectively stored in memory.

Figure 3:
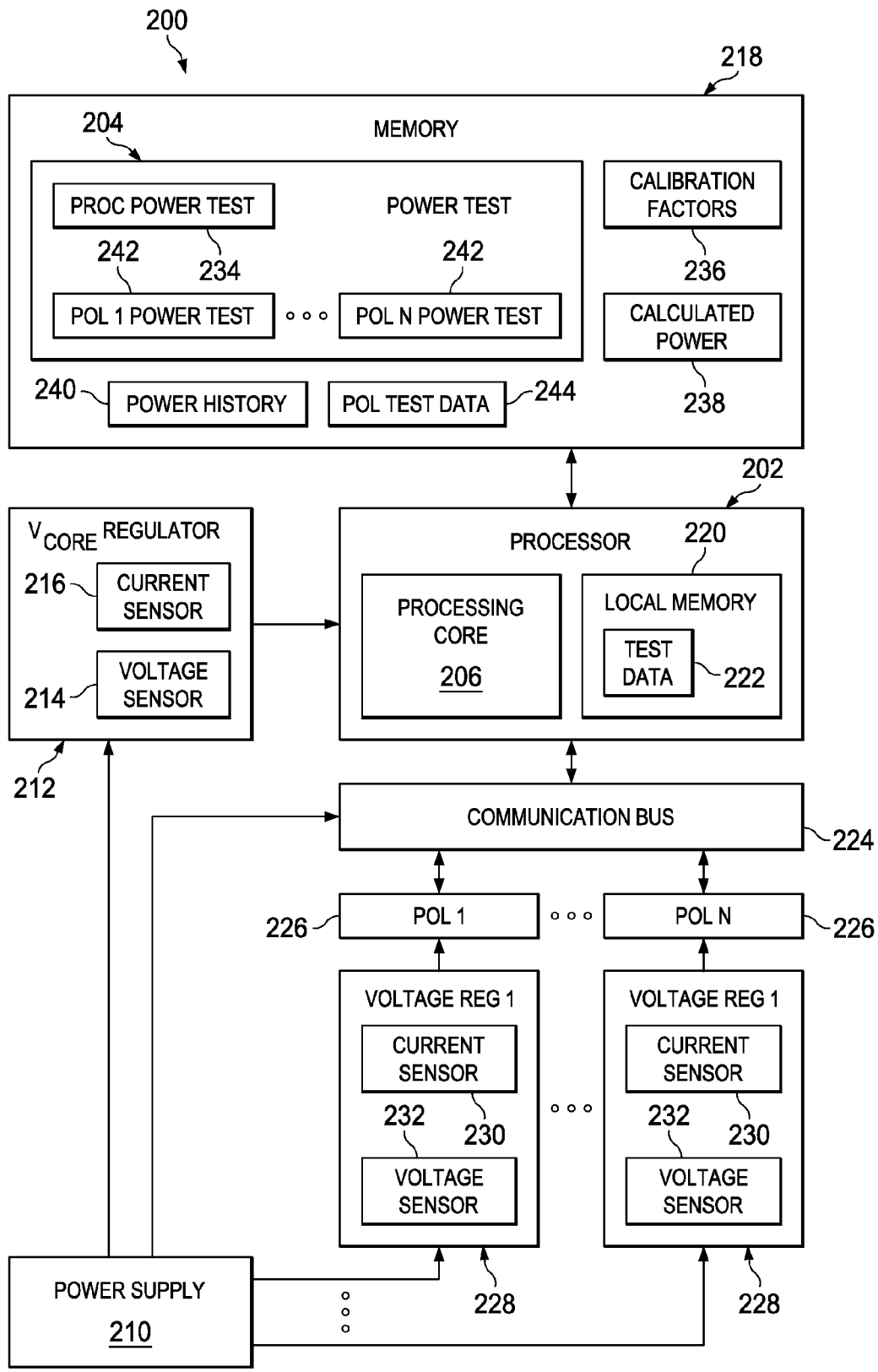
FIG. 3 illustrates another example of a system for calibrating a power measurement.

FIG. 3 illustrates another example of a system 200 that includes a processor 202 for calibrating a power test 204. The processor 202 can include a processing core 206 to execute machine readable instructions. The processor 202 could be implemented, for example, as a CPU, a microcontroller, an ASIC or the like. The system 200 could be implemented, for example, in a data center (e.g., a server farm).

The system 200 can include a power supply 210 that is coupled to a $V_{CORE}$ regulator 212. The $V_{CORE}$ regulator 212 can be implemented, for example, as a DC-to-DC converter that converts and regulates DC current from the power supply 210 to drive the processor 202. The $V_{CORE}$ regulator 212 can include a voltage sensor 214 (e.g., an ADC) that can provide a relatively accurate measurement of a real-time output voltage, $V_{m-out}$. Moreover, the $V_{CORE}$ regulator 212 can include a near lossless current sensor 216 (e.g., a DCR or a MOSFET current mirror) that can provide a real-time measurement of output current, $I_{m-out}$. However, the near lossless current sensor 216 can contain circuit components (e.g., inductors) with inherent inaccuracies due to component tolerances and/or temperature effects. These inaccuracies can lead to the real-time measurement of output current, $I_{m\text{-}out}$ to have an accuracy of less than 96% (e.g., 4% degree of inaccuracy).

The system 200 can also include a memory 218 (e.g., volatile memory, non-volatile memory or a combination thereof) that can store machine executable instructions. The memory 218 can be a non-transitory machine readable medium. The memory 218 can be implemented, for example, as main memory and/or as memory of a subsystem (e.g., a BIOS). The processor 202 can include a local memory 220 (e.g., OTP registers and/or rewriteable registers) that can store test data 222. In some examples, the test data 222 can be stored in the memory 218 (e.g., external memory) instead of the local memory 220. Similarly, some (or all) of the data stored in the memory 218 can be stored in the local memory 220. The test data 222 can include data that characterizes a measured impedance for the processor 202, $Z_{proc}$, a measured test voltage, $V_{mt\text{-}out}$ and/or a measured test current $I_{mt\text{-}out}$ as described with respect to FIG. 2.

The processor 202 can be connected to a communication bus 224, such as a power management bus (PMBus), a Peripheral Component Interconnect (PCI) bus, a PCI Express bus, a universal serial bus (USB) or the like. N number of points of load (POLs) 226 can be connected to the communication bus 224, where N is an integer greater than or equal to one. Each of the POLs 226 can be implemented, for example, as a device that receives a power signal from a corresponding voltage regulator 228 of N number of voltage regulators 228 that are coupled to the power supply 210. Each POL 226 can be, for example, a subsystem of the system 200. A given POL 226 could be implemented, for example, as a graphical processing unit (GPU), a USB hub, a network interface card, a BIOS, an ASIC, a controller, another processor, a memory, such as double data rate synchronous dynamic RAM, (DDR SDRAM), an external sensor or the like. In some examples, a given POL 226 can be a digital device and in other examples, the given POL 226 could be an analog device.

Each voltage regulator 228 can be implemented as a DC-to-DC converter that can regulate a power signal provided to a corresponding POL 226. In some examples, one or more of the voltage regulator 228 could be a second $V_{CORE}$ regulator. Each of the N number of voltage regulators 228 can include circuitry (e.g., telemetry circuitry) for communicating with the processor 202 (or other components) via the communication bus 224. Each voltage regulator 228 can include a nearly lossless current sensor 230 and a voltage sensor 232 that can be configured in a manner similar to the current sensor 216 and voltage sensor 214 of the $V_{CORE}$ regulator 212. The voltage sensor 232 of a given voltage regulator 228 can measure a real-time output voltage provided to the corresponding POL 226 and the current sensor 230 of the given voltage regulator 228 can measure a real-time output current provided to the corresponding POL 226.

The memory 218 can include the power test 204. The power test 204 can include a plurality of component power tests. For example, the power test 204 can include a processor power test 234 that can determine a power consumed by the processor 202. In such a situation, the processor power test 234 can implement a calibration process that can employ Equations 1-3 and the corresponding methods explained herein to a calculate calibration factor, $C_{factor}$ that can be stored in the memory 218 as calibration factors 236 and a power consumed by the processor 202, $P_{proc}$. The power consumed by the processor 202, $P_{proc}$ can be stored as calculated power 238 in the memory 218. Moreover, multiple measurements of the power employed by the processor 202, $P_{proc}$ can be stored and time stamped and stored as power history 240, which can be employed to calculate a power use of the system 200 over a given period of time in a manner described herein. For instance, the power history 240 can be provided as a moving time window of power measurements obtained over time. In some examples, the power history can also include a power efficiency that characterizes a ratio of power supplied to the $V_{CORE}$ regulator 212 by the power supply 210 and the calculated power 238 at each of the time stamps, such that a history of power usage of the processor 202 can be determined. In such a situation the power supply 210 can also include telemetry circuitry that can communicate with the processor 202 via the communication bus 224. Additionally, the power supply 210 can include a voltage sensor and a current sensor that, for example, measure an input or output voltage and current of the power supply 210.

Additionally, the power test 204 can include N number of POL power tests 242, wherein each of the N number of POL power tests 242 includes machine executable instructions for determining a calculated power for a corresponding POL 226. For instance, in a given example (hereinafter, "the given example"), POL 1 power test 242 can include machine executable instructions for determining a calculated power employed by the POL 1. In the given example, POL 1 power test 242 can access POL test data 244 that characterizes a test measured output voltage, $V_{POL1\text{-}mt\text{-}out}$ and a test measured output current, $I_{POL1\text{-}mt\text{-}out}$ and/or a measured impedance of the POL 1, $Z_{POL1}$. The POL test data 244 could be stored, for example, with the test data 222 in the local memory 220 of the processor 202, on the POL 1 or in the memory 218.

Continuing with the given example, a calibration process for the POL 1 power test 242 can be executed. To execute the calibration process of the POL 1 power test 242, the POL 1 power test 242 can cause the POL 1 to operate in a predetermined manner. In some situations, the predetermined manner of operation of the POL 1 can be the execution of a task routine included in the POL test 242, which can be a series of machine readable instructions (e.g., similar to the test routine explained with respect to FIG. 2) tailored for the operational characteristics of the POL 1.

A task routine could be, for example, a known controlled manipulation of data, a manipulation of data rate transfer speeds and/or a manipulation of functions executed by the POL 1. In other situations, such as situations where the POL 1 is an analog device, the processor 202 can execute a series of instructions that cause the POL 1 to operate in a known manner. During execution of the calibration process, in one example, the test measured output current, $I_{POL1\text{-}mt\text{-}out}$ can be directly compared to a measured current provided by the voltage regulator 1. In another example, during execution of the calibration process, a measured output voltage provided by the voltage regulator 1 for the POL 1, $V_{POL1\text{-}m\text{-}out}$ can be divided by the measured impedance, $Z_{POL1}$ of the POL 1 to determine a determined (e.g., calculated) current for the POL 1, $I_{POL1\text{-}d\text{-}out}$. In either example, a calibration factor for POL 1, $C_{POL1\text{-}factor}$ can be determined by comparing the measured current provided from the voltage regulator 1 with the determined current, $I_{POL1\text{-}d\text{-}out}$ or the test measured current, $I_{POL1\text{-}mt\text{-}out}$ since $I_{POL1\text{-}mt\text{-}out} \approx I_{POL1\text{-}d\text{-}out}$. The calibration factor for POL 1, $C_{POL1\text{-}factor}$ can be stored with the calibration factors 236 in the memory 218 to complete the calibration process. Additionally, the calibration factor for POL 1, $C_{POL1\text{-}factor}$ can be employed determine a power consumed by the POL 1, $P_{POL1}$ can be determined from Equation 5.

$$P_{POL1}=V_{POL1\text{-}m\text{-}out}*(C_{POL1\text{-}factor}*I_{POL1\text{-}m\text{-}out}) \quad \text{Equation 5:}$$

Moreover, similar to calculation of the power consumed by the processor 202, $P_{PROC}$, the power usage of the POL 1, $P_{POL1}$ can be stored and time stamped such that a power usage history of the POL 1 can be determined and stored in the power history 240. Power input into the voltage regulator 1 at the time stamps by the power supply 210 can stored in the power history such that the power test 204 can calculate a power efficiency of the POL 1.

The power usage of POL 2-POL N 226, $P_{POL2}$-$P_{POLN}$ can be calculated in a similar manner and time stamped at different instances of time. The total power consumed by the system 200, $P_{total}$ for a given instance in time can be determined from Equation 6:

$$P_{total}=P_{Proc}+\Sigma_{i=1}^{i=n}P_{POLi} \quad \text{Equation 6:}$$

Furthermore, the total power consumed by the system 200, $P_{total}$ can also be time stamped (with the given instance of time) and stored in the calculated power 238 and the power history, along with a corresponding power efficiency for the system 200 can be determined by the power test 204. The power efficiency for the system 200 can be the ratio of power provided to the power supply 210 and the total power consumed by the system 200, $P_{total}$ at a given instance of time. By tracking the power history of the system 200 over a set amount of time (e.g., seconds, hours, weeks, months or years) an accurate power efficiency for the power supply 210 can be calculated to determine power operational characteristics of the system 200. Moreover, the power history can be accurately determined without the need for lossy components (e.g., a shunt resistor) at current sensors (e.g., the current sensor 216 and/or the current sensor 230) that could lower the overall power efficiency of the system 200. Such lossy components in a current sensor, for example can consume about 1-5% of a signal being measured.

Figure 4:
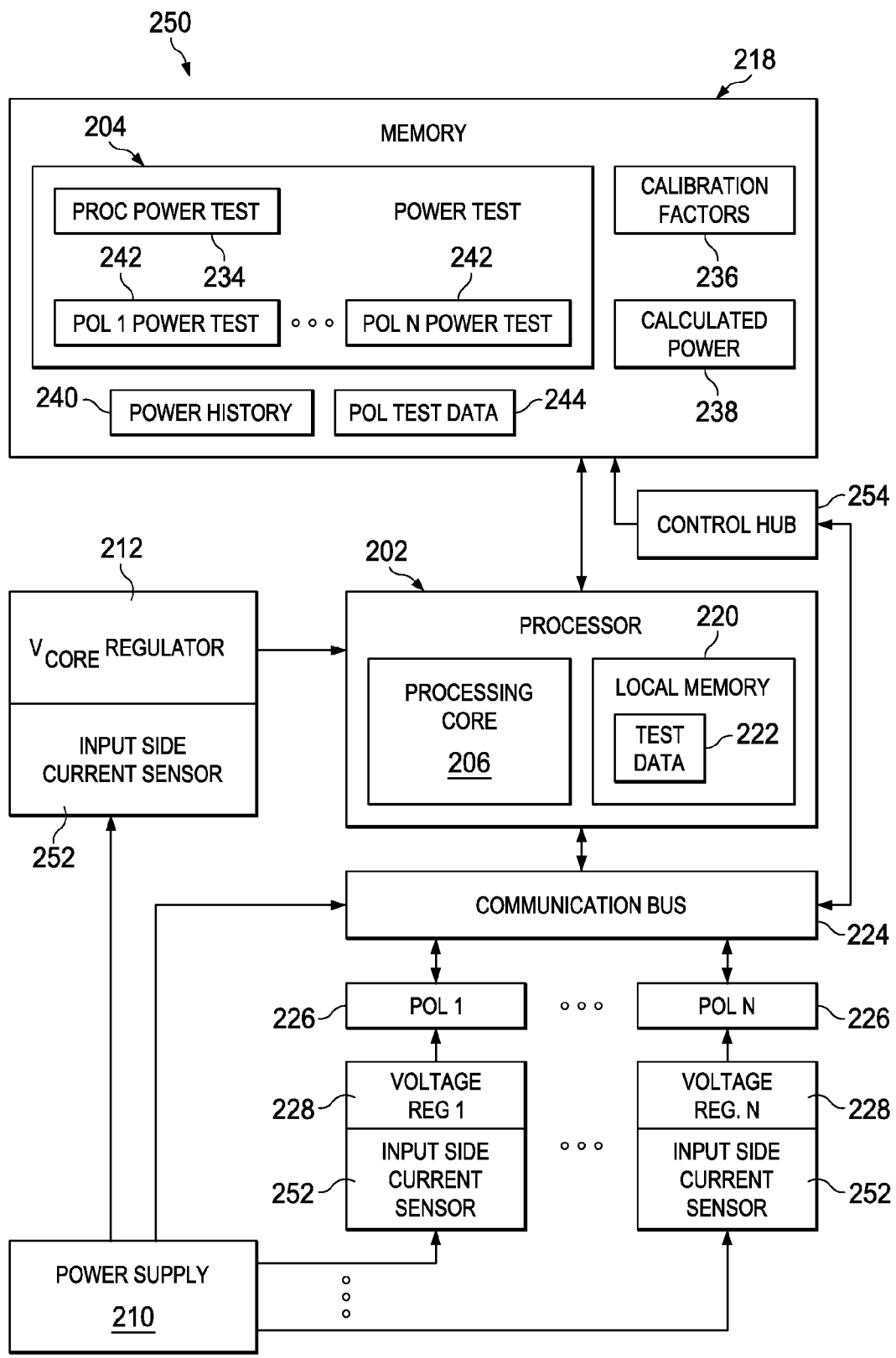
FIG. 4 illustrates yet another example of a system for calibrating a power measurement.

FIG. 4 illustrates yet another example of a system 250 that includes a processor configured for calibrating a power test. The system 250 in FIG. 4 and the system 200 in FIG. 3 are similar and can operate in a similar manner. Thus, the systems 200 and 250 in FIGS. 3 and 4 employ the same reference numbers to denote the same elements. Thus, for purposes of simplification of explanation, only the differences between the systems 200 and 250 illustrated in FIGS. 3 and 4 are explained in detail. Reference can be made back to FIG. 3 for additional information and context for common features.

In place of the current sensors 216 of the $V_{CORE}$ regulator 212 and the current sensors 230 of the voltage regulators 228 illustrated in FIG. 3, the system 250 can include input side current sensors 252 at each of the N number of voltage regulators 228 and at the $V_{CORE}$ regulator 212. As noted, the $V_{CORE}$ regulator 212 and each of the N number of voltage regulators 228 can be implemented as a DC-to-DC converter. The input side current sensors 252 can measure real-time current at an input voltage of the power supply (e.g., before a voltage regulator converts the input voltage to a lower voltage). Each input side current sensor 252 could be implemented, for example, as a current-shunt monitor. Employment of the input side current sensors 252 can increase the accuracy of the measured current for the $V_{CORE}$ regulator 212 and each of the N number of voltage regulators 228, thereby increasing the accuracy of the calculated power for processor 202 and each of the N number of POLs 226.

Additionally, the system 250 can include a control hub 254 that can execute the power test 204 in the manner described. The control hub 254 can communicate with other components of the system via the communication bus 224. The control hub 254 can be implemented for example, as a communication bus control hub (e.g., a microcontroller) that can operate independently of the processor, thereby alleviating the burden of executing the power test 204 at the processor 204. Additionally, in some examples, the control hub 254 can be coupled to an external source, such as a power monitor of a data center that can monitor a plurality of instances of the system 250.

Figure 5:
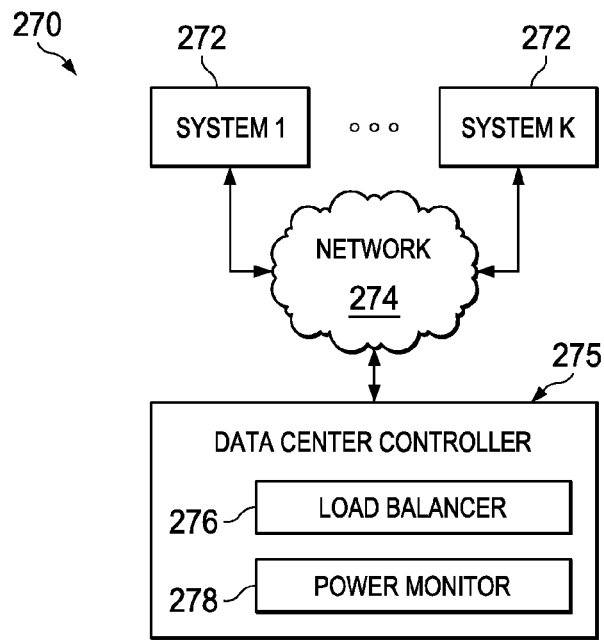
FIG. 5 illustrates an example of a data center.

FIG. 5 illustrates an example of a data center 270 that can include K number of systems 272 (e.g., each of the K systems corresponding to the system 2 illustrated in FIG. 1, the system 200 illustrated in FIG. 3 and/or the system 250 illustrated in FIG. 4) that can communicate over a network 274, where K is an integer greater than or equal to two. The network 274 could be implemented, for example as a local area network (LAN) a wide area network (WAN) or a combination thereof. In some examples, the data center 270 can be employed to implement a computer cluster, such as a cloud computing system, a server farm or a storage area network.

Each of the K number of systems 272 can process workloads (e.g., processes). Moreover, the data center 270 can include a data center controller 275 that operates a load balancer 276 (e.g., machine executable instructions) that can be implemented as a computer, such as the system 2 illustrated in FIG. 1, the system 200 illustrated in FIG. 3 and/or the system 250 illustrated in FIG. 4. The load balancer 276 can control which workloads are processed by which of the K number of systems 272. In some situations, a given system can process multiple workloads concurrently. Additionally or alternatively, a given workload may be distributed among multiple systems 272.

The data center controller 275 can include a power monitor 278. The power monitor 278 can be implemented as a process (e.g., machine readable instructions executing on a computer) that can communicate with one or more processors (e.g., the processor 202 of FIGS. 3 and 4) and/or a control hub (e.g., the control hub 254 of FIG. 4) at each of the K number of systems 272. The power monitor 278 can receive a power history (e.g., the power history 240 of FIGS. 3 and 4) from each of the K number of systems 272. The power monitor 278 can track the power usage and consumption of each of the K number of systems 272, as well as individual components of the K number of systems 272 (e.g., processors and/or POLs) to determine an overall power efficiency of the data center 270. Moreover, the load balancer 276 can adjust the distribution of the workloads to increase the power efficiency of the data center 270 based on the calibrated power measurements determined for each system 272, such as disclosed herein.

Figure 6:
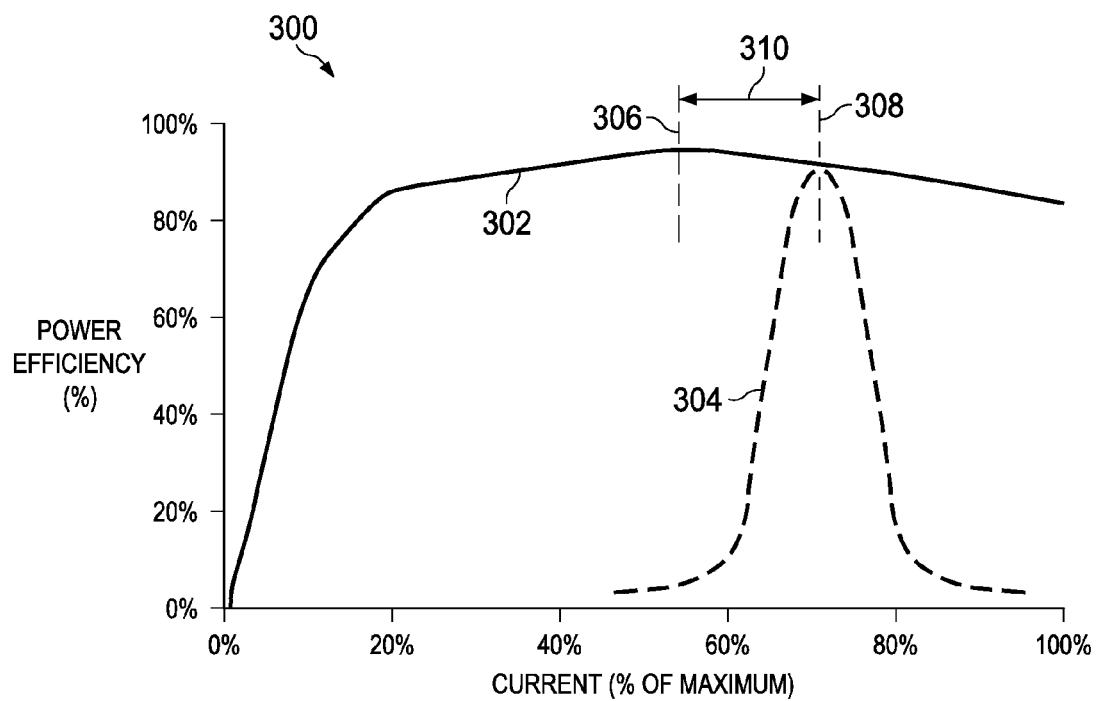
FIG. 6 illustrates an example of a graph that plots power efficiency as a function of a percentage of maximum current.

As a further example, FIG. 6 illustrates an example a graph with power efficiency in percentage (%) plotted as a function of maximum current employable by a module. The graph can be generated and analyzed, for example, by the power monitor 278 of the data center controller 275. As used herein, the module can represent an individual component (e.g., a processor or a POL), a combination of components on a single system (e.g., a processor and one or more POLs) or a data center (e.g., a plurality of systems 272 that each contain one or more components). The power efficiency can represent, for example, an amount of power consumed by the module divided by the total amount of power employed to drive the module. In other examples, the power efficiency can be calculated in different ways. The graph 300 includes two plots, an efficiency plot 302 and a histogram 304. The efficiency plot 302 and the histogram 304 can be plotted for the module.

The efficiency plot 302 can represent a power efficiency for the module. Thus, it is readily observable in the illustrated example of FIG. 6, that at a current of about 55% of the maximum current for the module, that the module has a power efficiency of about 95%, which point can be referred to as a peak operating efficiency point, designated at 306. The histogram 304 can represent a percentage of time for a given time period that the module draws a particular percentage of current and achieves a specific efficiency percentage. The period of time can represent, for example, minutes, hours, days, weeks or months. The histogram 304 can be, for example a bell curve (e.g., Gaussian distribution). In the example illustrated, the histogram 304 has a normal distribution about mean value 308 with an efficiency of about 92 and a current draw of about 74% of the maximum current of the module. As illustrated, there is a deviation indicated by an arrow 310 between the mean of the histogram 304 and the peak operating efficiency point 306.

Referring back to FIG. 5, the power monitor 278 can provide data characterizing the graph 300 for the module to the load balancer 276. The power monitor 278 can execute a power adjustment process that can cause the load balancer 276 can modify distribution of the workloads among the K number of systems 272 to alter the power utilization of the data center 270. Moreover, in some examples, the power monitor 278 can alter operational characteristics (e.g., a frequency) of a power supply (e.g., a power supply of the 1-K systems 272, a $V_{CORE}$ regulator or a voltage regulator) to change the peak operating efficiency point of the module.

FIG. 7 illustrates an example of a graph 350 that represents the graph 300 illustrated in FIG. 6 after execution of the power adjustment process by the power monitor 278. As is illustrated, the mean value 308 of the histogram 304 substantially overlaps the peak efficiency point 306 of the power supply for the module. Thus, an operating efficiency of the module can be increased such that the overall power costs associated with operating the module can be reduced. Moreover, as explained with respect to FIGS. 1-5, each of the K number of systems 272 and the associated components can provide a relatively accurate power history, such that the graph 300 can closely reflect actual operational characteristics of the module.

FIG. 8 illustrates an example of a method 400 for determining a power consumed by a component of a system (e.g., a processor 202 or a POL 226 of FIGS. 3 and 4). The method 400 could be implemented, for example, by the system 2 illustrated in FIG. 1 and/or the system 200 illustrated in FIG. 3. The example method 400 of FIG. 8 can be implemented as machine executable instructions. The instructions can be accessed by a processing resource (e.g., one or more processor cores) and executed to perform the methods disclosed herein. In some examples, actions of the method 400 can be executed by a processor of a computer system.

At 410, test data (e.g., the test data 222 illustrated in FIG. 3 or 4) can be received (e.g., by the component or a processor). The test data can include, for example, data characterizing an impedance of the component and/or a measured test current of the component during execution of a test routine or a task routine. At 420, data characterizing an output voltage and an output current provided to the component can be received (e.g., at the component or the processor), such as provided by a voltage regulator (e.g., the $V_{CORE}$ regulator 212 or the voltage regulator 228 of FIGS. 3 and 4). At 430, a calibration factor for the component can be determined (e.g., by the component or the processor). The calibration factor can be determined, for example, by employing Equations 1-3 during execution of a test routine (e.g., at a processor) or a task routine (e.g., at a POL). At 440, a power consumed by the component can be determined (e.g., by the component or the processor). The power consumed can be determined based on the calibration factor and the received measured voltage and the received measured current. At 450, a power history for the component can be determined (e.g., by the component or the processor). The power history can also be stored in memory. The power history can include, for example, multiple instances of determined power consumed by the component as well as a time stamp. In some examples, determination of the power history can also include determining a power efficiency of the component based on data provided by a power supply that drives the component.

FIG. 9 illustrates an example of a method 500 for managing power efficiency of a module. The module could be implemented, for example, as a single component (e.g., a processor 202 or a POL 226 of FIGS. 3 and 4), a system (e.g., the system 200 or 250 of FIGS. 3 and 4) or a data center (e.g., the data center 270 of FIG. 5). The method 500 could be implemented, for example, by the data center 270 illustrated in FIG. 5. The example method 500 of FIG. 9 can be implemented as machine executable instructions. The instructions can be accessed by a processing resource (e.g., one or more processing cores) and executed to perform the methods disclosed herein. In some examples, actions of the method 500 can be executed by a data center controller of the data center.

At 510, a power history for the module can be received (e.g., by the power monitor 278 of FIG. 5). At 520, a workload distribution can be adjusted (e.g., by the load balancer 276 of FIG. 5) based on the power history of the module. At 530, power supply operating characteristics (e.g., a frequency) can be adjusted (e.g., by the power monitor).

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
  a processing core configured to execute machine readable instructions; and
  memory accessible by the processing core, wherein the memory includes preprogrammed test data that characterizes one of an impedance of a processor and a current output to the processor during execution of a test routine, wherein the processor includes the processing core, wherein the one of the impedance of the processor and the current output to the processor is based on a power measurement taken during execution of the test routine, wherein the power measurement is taken used to generate a calibration factor used during normal operation of the system to generate an accurate processor current measurement without need for a lossy current sensor.

2. The system of claim 1, wherein the memory comprises a plurality of registers embedded in the processor.

3. The system of claim 1, wherein the test routine comprises a plurality of machine readable instructions programmed to control power usage by the processor during execution of the test routine.

4. The system of claim 3, wherein the test routine causes the processor to ramp power usage over at test time period upon execution.

5. The system of claim 3, wherein the test routine causes the processor to increment power usage according to a prescribed step size upon execution.

6. The system of claim 3, wherein data identifying the test routine is stored in the preprogrammed test data.

7. The system of claim 1, wherein the preprogrammed test data includes data characterizing a clock speed of the processor during execution of the test routine.

8. The system of claim 1, wherein the power measurement is based on a measurement of voltage and current provided directly to the processor.

9. A system comprising:
a processing core configured to execute machine readable instructions; and
memory accessible by the processing core, wherein the memory includes preprogrammed test data that characterizes one of an impedance of a processor and a current output to the processor during execution of a test routine, wherein the processor includes the processing core, wherein the one of the impedance of the processor and the current output to the processor is based on a power measurement taken during execution of the test routine, wherein the power measurement is taken with a current sensor that is at least one of lossy or at least about 98% accurate, further comprising:
a voltage core regulator comprising a substantially lossless current sensor, the voltage core regulator being configured to:
provide power to the processor; and
output data that characterizes a real-time current output to the processor by the voltage core regulator, wherein the memory further comprises:
a power test configured to:
determine a calibration factor for the processor based on the test data and the real time current provided to the processor; and
determine a calibrated power consumed by the processor based on the calibration factor and the real-time current provided to the processor.

10. The system of claim 9, wherein the power test is further configured to determine a real-time current provided to the processor based on the impedance of the processor and data provided from the voltage core regulator that characterizes a real-time voltage output to the processor by the voltage core regulator.

11. The system of claim 9, wherein the power test is further configured to determine the calibration factor during execution of the test routine at the processor.

12. The system of claim 9, wherein the voltage core regulator is coupled to a power supply, the system further comprising:
a voltage regulator coupled to the power supply; and
a point of load (POL) configured to receive power from the voltage regulator, wherein the voltage regulator is configured to output data characterizing a real-time current measurement of current output to the POL;
wherein the power test is further configured to determine the calibration factor for the POL that characterizes a deviation between the real-time current measurement and a current provided to the POL during execution of a task routine, wherein the calibration factor is determined during execution of the task routine, wherein the task routine comprises one of a series of instructions executed by the POL and a series of instructions executed by the processor that cause the POL to operate in a predictable manner.

13. The system of claim 12, wherein the POL comprises one of an analog circuit and a graphical processing unit.

14. The system of claim 12, further comprising an input side current sensor configured to measure a current input into the voltage regulator.

15. A method comprising:
executing a test routine on a processor that executes machine readable instructions;
measuring, with a lossy current measuring device, a current provided to the processor during the test routine, wherein the test routine comprises a plurality of machine readable instructions;
storing test data that characterizes the measuring in a memory;
generating a calibration factor used during normal operation of the system generated accurate processor current measurement without need for a lossy current sensor.

16. The method of claim 15, wherein the test data is stored in a register of the processor.

17. The method of claim 15, wherein the test data comprises data that characterizes an impedance of the processor.

18. A data center comprising:
a plurality of computers that are each configured to store a power history, wherein a given power history of a given computer of the plurality of computers comprises a time-stamped instance of a calculated power consumed by the given computer;
wherein the calculated power is based on a real-time measured current provided to the given computer and a calibration factor;
wherein the calibration factor is based on test data characterizing one of an impedance of a processor of the given computer and a current provided to the processor of the given computer during execution of a test routine by the processor; and
a data center controller configured to adjust a workload assigned to each of the computers based on the power history of each of the computers.

19. The data center of claim 18, wherein the data center controller is further configured to adjust an operating characteristic of a power supply coupled to the given computer based on the power history of the given computer.

* * * * *